United States Patent
Goetz et al.

(10) Patent No.: US 7,471,884 B2
(45) Date of Patent: Dec. 30, 2008

(54) RESISTANCE-HEATED VAPORIZER BOAT

(75) Inventors: Ulrich Goetz, Helblech (DE); Rob Lattimer, Wilton, CT (US)

(73) Assignee: Sintec Keramik GmbH, Halblech (DE)

( * ) Notice: Subject to any disclaimer, the term of this patent is extended or adjusted under 35 U.S.C. 154(b) by 521 days.

(21) Appl. No.: 10/541,329

(22) PCT Filed: Dec. 19, 2003

(86) PCT No.: PCT/EP03/14676

§ 371 (c)(1),
(2), (4) Date: Feb. 21, 2006

(87) PCT Pub. No.: WO2004/063419

PCT Pub. Date: Jul. 29, 2004

(65) Prior Publication Data

US 2006/0223020 A1    Oct. 5, 2006

(30) Foreign Application Priority Data

Jan. 8, 2003  (DE)  ............... 203 00 167
Jun. 18, 2003 (DE)  ............... 203 09 444

(51) Int. Cl.
*B01D 7/00* (2006.01)
*F27B 14/10* (2006.01)

(52) U.S. Cl. .................. 392/389; 432/262
(58) Field of Classification Search .......... 392/389, 392/386, 387, 388, 390; 432/262; 266/275
See application file for complete search history.

(56) References Cited

U.S. PATENT DOCUMENTS

| | | | |
|---|---|---|---|
| 2,996,412 A | 8/1961 | Alexander | |
| 3,598,958 A | 8/1971 | Davey | |
| 4,089,643 A | 5/1978 | Jerabek | |
| 5,216,742 A * | 6/1993 | Krug et al. | 392/389 |
| 5,395,180 A * | 3/1995 | Mariner | 392/389 |
| 6,085,025 A * | 7/2000 | Seifert | 392/389 |
| 2004/0042770 A1* | 3/2004 | Choe et al. | 392/389 |

FOREIGN PATENT DOCUMENTS

| | | |
|---|---|---|
| DE | 19545914 | 11/1996 |
| DE | 19708599 | 4/1998 |
| WO | 97/21847 | 6/1997 |

* cited by examiner

*Primary Examiner*—Daniel L Robinson
(74) *Attorney, Agent, or Firm*—Schlee IP International, P.C.; Alexander R. Schlee

(57) ABSTRACT

Resistance-heated ceramic vaporizer boat (10) comprising an elongated vaporizer body having an upper side (1) and a lower side (2) being parallel to each other, and the vaporizer body having plane lateral side surfaces (3) being non-parallel to each other, wherein each of said lateral side surfaces (3) is inclined by an angle of 45° with respect to the upper side (1). Preferably, the end portions at the longitudinal ends of the vaporizer body are reduced, at the lower side (2) thereof, to a predetermined partial thickness (t), whereby a cavity at the upper side (1) of the vaporizer body can be omitted.

14 Claims, 3 Drawing Sheets

RESISTANCE-HEATED VAPORIZER BOAT

The present invention relates to a resistance-heated ceramic vaporizer boat comprising an elongated vaporizer body.

Resistance-heated ceramic vaporizer boats made of electrically conductive ceramic material for vaporizing metals are, among others, made of titanium boride, boron nitride, aluminium nitride or of a mixture of those materials, and exhibit a small cross section as compared to their respective longitudinal extension. Typical lengths may be, for example, 100 mm to 500 mm. By connecting a current source to the clamping ends, a certain current flow per unit of cross-sectional area is flowing through the vaporizer boat in the longitudinal direction thereof.

The standard cross section of vaporizer boats is rectangular, with, for example, a width of 30 mm and a height of 10 mm.

DE 195 45 914 A discloses a vaporizer boat with a shallow triangular cross section having, for example, a width of 30 mm and a height of 10 mm.

According to U.S. Pat. No. 4,089,643 A, the vaporizer boat has an isosceles triangular cross section, and is provided at its upper side with a cavity milled into it, in order to accommodate the metal melt to be vaporized.

In U.S. Pat. No. 2,996,412 A, vaporizer boats are described with swallow trapezoidal isosceles cross section, being made from a graphite based composite material and comprising a metal stripe received in the upper side, wherein the angle between the upper side and each lateral side surface of the vaporizer boat is about 30°.

According to the present invention, a vaporizer boat of the present kind is provided, which shows a good and stable behavior in operation and can be manufactured at moderate manufacturing costs.

According to the present invention, the resistance-heated ceramic vaporizer boat is provided with an elongated vaporizer body comprising an upper side and a lower side extending parallel to each other, and comprising non-parallel plane lateral side surfaces, each of which being inclined with respect to the upper side by an angle of 45°.

The cross-sectional shape of the ceramic vaporizer boat according to the present invention is substantially in the form of an isosceles trapezoid, wherein the ratio between width and height as well as the length may be chosen freely to the greatest possible extent. Since the lateral side surfaces are disposed at an angle of 45° with respect to the upper side, the vaporizer boat as compared to vaporizer boats having a swallow triangular cross section comprises a higher mass, and it is altogether more stable in its lateral areas, with the advantage that an operator does not need to react as sensitively when operating such vaporizer boats, whereby the operational costs for the facilities can be reduced by applying said vaporizer boats.

Further advantages of the vaporizer boat according to the present invention are that in its middle the conductive cross section of the material to be vaporized remains unchanged, as compared to the vaporizer boat having a rectangular cross section, so that the use of the vaporizer boat according to the present invention leads altogether to a more stable and more quiet operational behavior.

A further advantage of the vaporizer boat according to the present invention is its manufacturing by itself. The ceramic material for the production of the vaporizer boats is provided as a raw block of a rectangular shape. At first, disks/plates can be separated from this raw block, which disks/plates show a thickness corresponding to the height of the vaporizer boats. From these disks/plates, the vaporizer boats can be easily produced by simple separating cuts laid in an angle of 45°, wherein the distances at which the cuts are carried out alternatingly correspond to the width of the upper side and the width of the lower side of each vaporizer boat, respectively. In this manner, the vaporizer boats can be easily manufactured from the ceramic conductive material with substantially no waste cut.

According to an embodiment, the upper side, comprising the vaporizing surface, comprises a cavity into which the material to be vaporized is supplied. The metal can be localized by means of this cavity. The metal does not flow over the border regions, but can be vaporized precisely upwards from the vaporizing surface. It is, however, also possible that the vaporizer boat has a plane (upper) vaporizing surface without a cavity, and that the localizing of the melt is obtained, due to the different temperatures at the lateral side surfaces of the vaporizing body, by different wetting tendencies only.

According to a further embodiment, clamping regions are shaped at the vaporizer boat at free end portions thereof, which clamping regions are not higher than the height of the vaporizer boat, and which clamping regions are formed from two clamping surfaces being laterally opposite to each other with respect to the vaporizer boat and being collocated at both sides thereof and being extended in the longitudinal direction of the vaporizer boat, such that the vaporizer boat can be clamped at these lateral clamping surfaces in a plane shaped manner. At these clamping regions, the vaporizer boat can be connected thermally and electrically conductively to a corresponding clamping device.

According to an improvement of the aforementioned embodiment, the clamping surfaces are extended parallel to each other and the clamping region comprising the clamping surfaces as well as the lower and upper sides of the vaporizer boat has a substantially rectangular cross section.

Alternatively, even the free end portions of the vaporizer boat can by themselves serve as clamping regions without further treatment. In such a case, the vaporizer boat is received within a clamping device, thereby being supported at its face surfaces, and the vaporizer boat accordingly is connected thermally and electrically conductively to the clamping device.

According to a further embodiment of the present invention, the end portions are recessed at the longitudinal ends of the vaporizer body at the lower side thereof.

The advantages of such an embodiment are in particular to be seen in that the end portions in the recessed regions have a reduced cross section, so that the electrical resistance is correspondingly higher in these regions, and a temperature rise at the end surfaces is noted due to the higher current drop.

Clamping of the vaporizer boat at its end portions into the clamping device counteracts this temperature rise by conducting off the heat to the clamping device, which results in a homogeneous temperature distribution along the whole length of the vaporizer boat, if accordingly optimised. The advantages are, in particular, that the possibility of an overflow of the material to be vaporized, e.g. aluminium, to the preferably water cooled clamping devices at both sides of the vaporizer body is significantly reduced. In this way, spattering or unequal vaporizing are avoided.

The embodiment with recessed end portions at the longitudinal ends of the vaporizer boat is especially well suited for face surface clamping of the vaporizer boat at the face ends thereof, although this embodiment can advantageously be used as well, when lateral clamping surfaces are formed at the end portions.

According to a further development of this embodiment, the thickness of the vaporizer body, when measured between the upper and lower sides thereof, is reduced along a transition radius to a predetermined partial thickness in the regions of the end portions of the vaporizer body at the lower side of the end portions.

Therefore, according to such an embodiment having, due to the recess, a reduced cross section along the end portions of the vaporizer boat, it is not necessary to provide a cavity in the vaporizer body.

According to a further development, the ratio between the thickness of the vaporizer body and the partial thickness of its end portions is 10:7.

According to a further embodiment, the ratio between the length of the vaporizer body and the length of each end portion is 13:1.

According to a further embodiment, the ratio between the length of the vaporizer body and the width at the upper side thereof is 130:35.

In the following, the present invention is further illustrated with reference to the drawings, in which.

Figure 1:
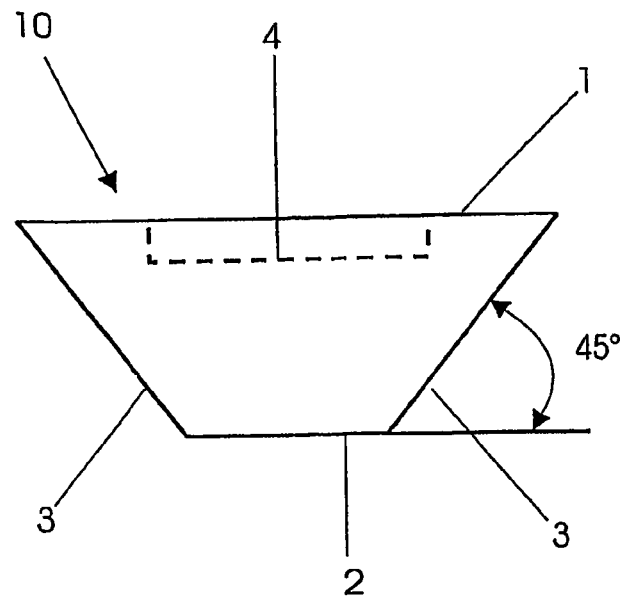
FIG. 1 is a cross section of a vaporizer boat according to the present invention.

As can be seen in FIG. 1, the vaporizer boat 10, being made of homogeneous ceramic material, has a trapezoidal cross section comprising an upper side 1 and a lower side 2 being parallel to each other. The lateral side surfaces 3 are inclined, and each of them encloses an angle of 45° with the upper side 1, so that the cross section of the vaporizer body is of isosceles trapezoidal shape. In order to localize the metal to be vaporized, a cavity 4 is formed in the upper side 1 comprising the vaporizing surface, said cavity 4 extending along the longitudinal direction of the vaporizer boat 10. The ratio between the width of the upper side 1 and the height of the vaporizer boat 10 is preferably 3:1.

According to a preferred embodiment, the upper side 1 has a width of 30 mm, whereas the lower side has a width of 10 mm and, therefore, the height of the vaporizer boat 10 is 10 mm as well. Other surface dimensions may be chosen, so that the width of the upper side 1 is greater than twice the height of the vaporizer boat 10. The length of the vaporizer boat 10 depends on the geometry of the facilities and typically is about 80 mm up to more than 500 mm.

Figure 2:
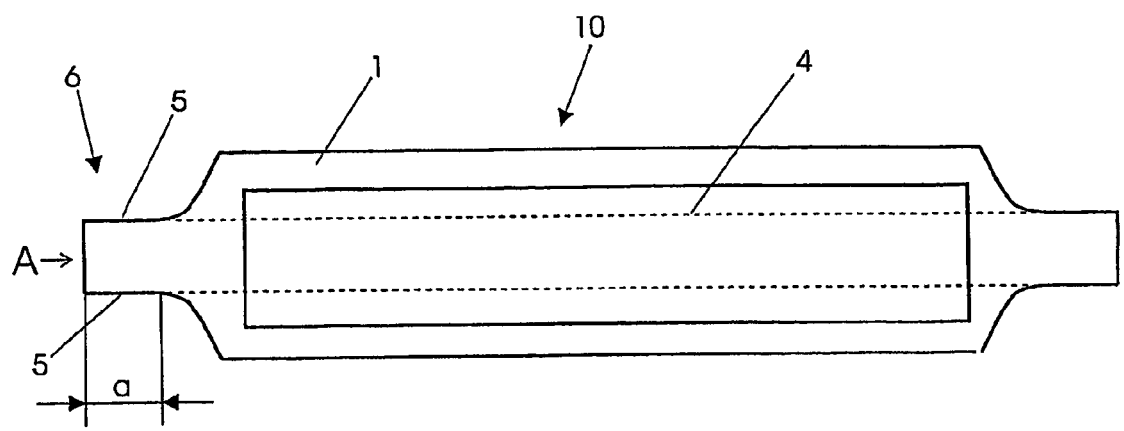
FIG. 2 is a top view of a vaporizer boat with shaped lateral clamping surfaces.
Figure 3:
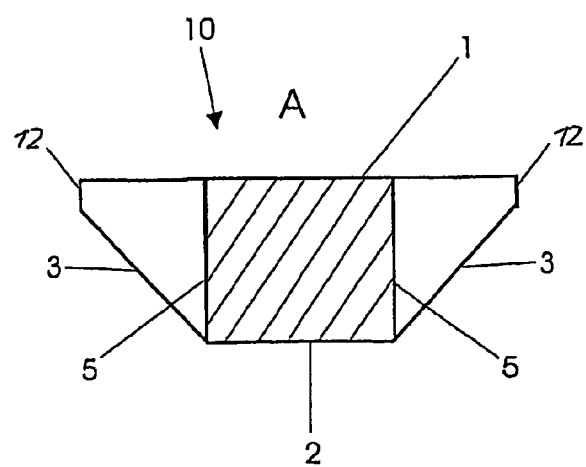
FIG. 3 is a cross section of a vaporizer boat shown in FIG. 2.

As can be seen in FIGS. 2 and 3, the vaporizer boat 10, at the free end portions thereof, has clamping regions 6 being formed by means of two clamping surfaces 5 being opposite to each other and being extended into the longitudinal direction of the vaporizer boat 10, wherein according to this embodiment the two lateral clamping surfaces 5 being opposite to each other extend parallel to each other and join the vaporizer body with a large radius. The length a of the clamping surfaces 5 is preferably 5 mm to 20 mm, depending on the overall size of the vaporiser boat 10. The cavity 4 within the upper side 1 preferably extends in longitudinal direction at both sides approximately up to the clamping region 6 and has a depth of about 1 mm. On the other hand, it is also possible to omit the cavity 4.

As can further be seen from FIG. 3, the parallel clamping surfaces 5 are collocated with a lateral distance between each other corresponding to the width of the lower side 2, such that the clamping region 6 has a substantially rectangular cross-sectional form. According to this embodiment, additional edging surfaces 12 are provided between the upper side 1 and the lateral side surfaces 3.

Figure 4:
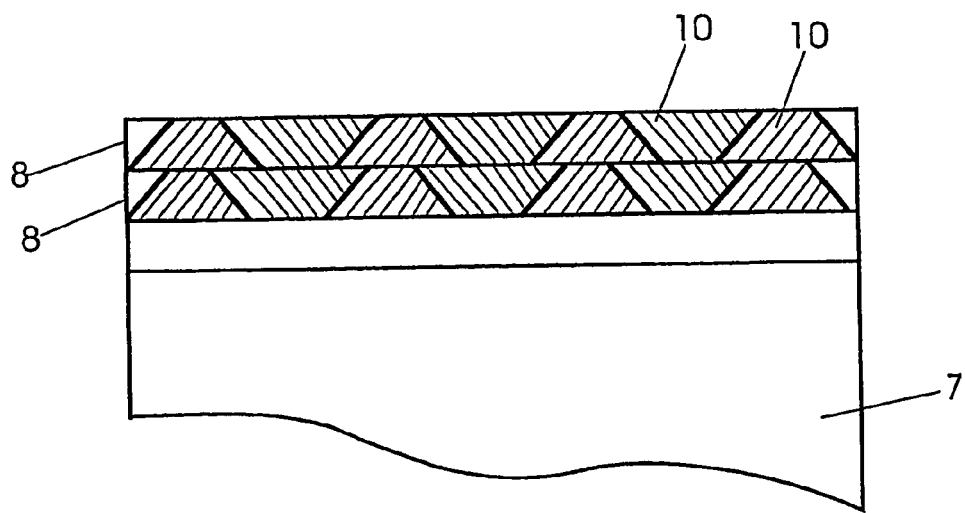
FIG. 4 is a raw block from which the vaporizer boats according to the present invention can be manufactured.

FIG. 4 shows a raw block 7 of ceramic material, from which the vaporizer boats 10 are manufactured. At first, disks/plates 8 with a height corresponding to the height of the vaporizer boats 10 can be ablated from the raw block 7 by, for example, sawing, abrasive cutting or cutting. These disks/plates 8 can be dissected by simple cuts being applied alternatingly leftwards and rightwards with an angle of 45°, thereby forming the vaporizer boats 10, such that the manufacturing thereof does hardly produce any waste cut.

Figure 5:
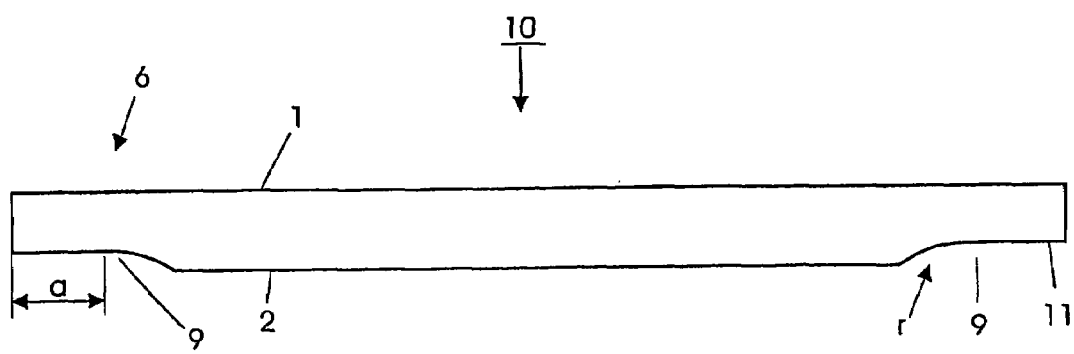
FIG. 5 is a longitudinal view of a vaporizer boat according to a further embodiment.
Figure 6:
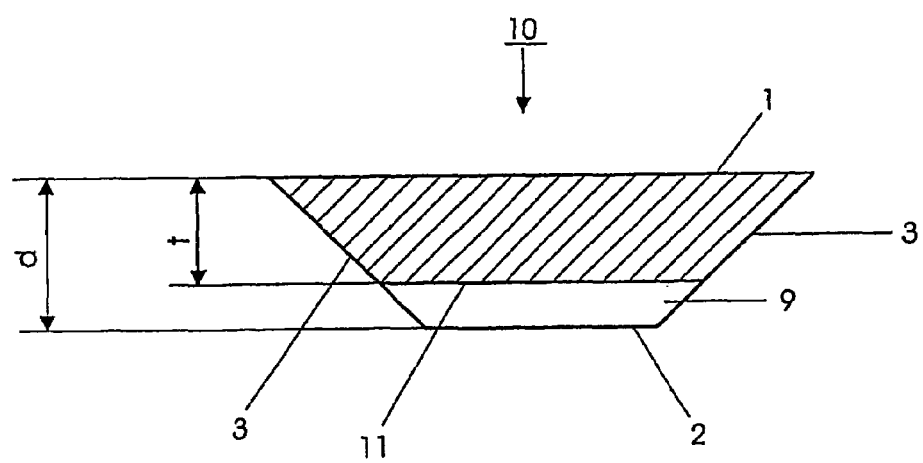
FIG. 6 is a cross-sectional view of a vaporizer boat according to FIG. 5.

In FIG. 5 and FIG. 6 is shown a longitudinal view and a cross sectional view, respectively, of a vaporizer boat 10 of that embodiment according to which the vaporizer boat 10 has a recess 9 at its lower side 2 at each of the two end portions thereof, said two end portions comprising the respective clamping regions 6. Each recess 9 is formed by a reduction of the thickness d of the vaporizer body along a transfer radius r to a partial thickness t along the end portions. According to this embodiment, the lateral side surfaces 3 both enclose an angle of 45° with the upper side 1 along the whole length of the vaporizer boat 10, which means inclusive of the regions of the end portions.

Preferably, the vaporizer boat 10, at least along a partial region of the lower side 11 of the clamping region 6, is thermally and electrically conductively received by a clamping device (not shown), which clamping device catches the vaporizer boat 10 at its free face surfaces in a clamping manner in a longitudinal direction. Since the cross section of the clamping regions 6 is reduced by the recess 9, the electrical resistance in these regions is higher than in the vaporizer body not being recessed, whereby a temperature rise is noted in the end portions. Since, however, the clamping device is cooled, there results a compensation of temperature in these clamping regions and preferably in such a way that the temperature distribution is homogeneous along the whole length of the vaporizer boat.

The invention claimed is:

1. Resistance-heated ceramic vaporizer boat (10) comprising an elongated vaporizer body made of homogeneous ceramic material and having an upper side surface (1) and plane lateral side surfaces (3) which are non-parallel to each other, each of said lateral side surfaces (3) is inclined to enclose an angle of 45° with the upper side surface (1), wherein the vaporizer body is formed in a generally trapezoidal cross-section so that the vaporizer body has a lower side surface (2) which is parallel to the upper side surface (1) and the ratio between the width of the upper side surface (1) and the height of the vaporizer body as measured between the upper side surface and the lower side surface (2) is greater than 2:1.

2. Resistance-heated ceramic vaporizer boat (10) according to claim 1, comprising clamping regions (6) being formed at the free end portions of the vaporizer boat (10), the height of which clamping regions (6) not exceeding the height of the vaporizer boat (10), and the clamping regions (6) comprising two lateral clamping surfaces (5) being laterally opposite to each other and extending in the longitudinal direction of the vaporizer boat (10).

3. Resistance-heated ceramic vaporizer boat (10) according to claim 2, wherein the clamping surfaces (5) extend parallel to each other, and wherein the clamping region (6)

comprising the clamping surfaces (5), the upper side (1) and the lower side (2), has a substantially rectangular cross section.

4. Resistance-heated ceramic vaporizer boat (10) according to claim 1, wherein a cavity (4) is formed in the upper side (1).

5. Resistance-heated ceramic vaporizer boat (10) according to claim 1, comprising longitudinally extending edging surfaces (12) between the upper side (1) and the lateral side surfaces (3).

6. Resistance-heated ceramic vaporizer boat (10) according to claim 1, wherein the end portions at the longitudinal ends of the vaporizer body are recessed at the lower side (2) thereof.

7. Resistance-heated ceramic vaporizer boat (10) according to claim 6, wherein the thickness (d) of the vaporizer body being measured between the upper side (1) and the lower side (2) thereof, is reduced along a transition radius (r) to a predetermined partial thickness (t) along the end portions of the vaporizer body at the lower side (2) of the end portions.

8. Resistance-heated ceramic vaporizer boat (10) according to claim 7, wherein the ratio between the thickness (d) of the vaporizer boat (10) and the partial thickness (t) of the end portions thereof is 10:7.

9. Resistance-heated ceramic vaporizer boat (10) according to claim 8, wherein the ratio between the length of the vaporizer boat (10) and the length of each end portion is 13:1.

10. Resistance-heated ceramic vaporizer boat (10) according to claim 8, wherein the ratio between the length of the vaporizer boat (10) and its width at the upper side (1) thereof is 130:35.

11. Resistance-heated ceramic vaporizer boat (10) according to claim 6, wherein the upper side (1) of the vaporizer body is plane without a cavity.

12. Resistance-heated ceramic vaporizer boat (10) according to claim 6, wherein the lateral side surfaces (3) of the vaporizer body each enclose an angle of 45° with the upper side along the whole length of the vaporizer body inclusive of the regions of the free end portions thereof.

13. Resistance-heated ceramic vaporizer boat (10) according t claim 2, Wherein the lateral distance between the clamping surfaces (5) corresponds to the width of the lower side (2) of the trapezoidal cross-section.

14. Resistance-heated ceramic vaporizer boat, according to claim 1, wherein the ratio between the width of the upper side surface (1) and the height of the vaporizer body as measured between the upper side surface and the lower side surface (2) is 3:1.

\* \* \* \* \*